(12) United States Patent
Gejo et al.

(10) Patent No.: US 9,761,582 B2
(45) Date of Patent: Sep. 12, 2017

(54) SEMICONDUCTOR DEVICE AND METHOD OF MANUFACTURING SEMICONDUCTOR DEVICE

(71) Applicant: Kabushiki Kaisha Toshiba, Minato-ku, Tokyo (JP)

(72) Inventors: Ryohei Gejo, Kanazasa Ishikawa (JP); Kazutoshi Nakamura, Inonoichi Ishikawa (JP); Norio Yasuhara, Kanazawa Ishikawa (JP); Tomohiro Tamaki, Inonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/255,336

(22) Filed: Sep. 2, 2016

(65) Prior Publication Data

US 2017/0110449 A1   Apr. 20, 2017

(30) Foreign Application Priority Data

Oct. 19, 2015 (JP) .................................. 2015-205661

(51) Int. Cl.
| | |
|---|---|
| *H01L 27/06* | (2006.01) |
| *H01L 29/167* | (2006.01) |
| *H01L 29/207* | (2006.01) |
| *H01L 29/423* | (2006.01) |
| *H01L 21/8249* | (2006.01) |
| *H01L 29/417* | (2006.01) |
| *H01L 29/08* | (2006.01) |
| *H01L 29/32* | (2006.01) |

(Continued)

(52) U.S. Cl.
CPC ........ *H01L 27/0664* (2013.01); *H01L 21/761* (2013.01); *H01L 21/8249* (2013.01); *H01L 27/0629* (2013.01); *H01L 27/0761* (2013.01); *H01L 29/0834* (2013.01); *H01L 29/167* (2013.01); *H01L 29/207* (2013.01); *H01L 29/32* (2013.01); *H01L 29/41708* (2013.01); *H01L 29/42312* (2013.01); *H01L 29/7391* (2013.01); *H01L 29/7397* (2013.01); *H01L 29/861* (2013.01)

(58) Field of Classification Search
None
See application file for complete search history.

(56) References Cited

U.S. PATENT DOCUMENTS

| | | |
|---|---|---|
| 8,686,467 B2 | 4/2014 | Iwasaki et al. |
| 8,841,699 B2 | 9/2014 | Tsuzuki et al. |

(Continued)

*Primary Examiner* — Ermias Woldegeorgis
(74) *Attorney, Agent, or Firm* — White & Case LLP

(57) ABSTRACT

A semiconductor device comprising:
a first electrode;
a first semiconductor region of a first conductivity type; a second semiconductor region of a second conductivity type; a third semiconductor region of the second conductivity type provided between the first semiconductor region and the second semiconductor region on the first electrode and having a higher carrier concentration of the second conductivity type than the second semiconductor region; a fourth semiconductor region; a fifth semiconductor region; a sixth semiconductor region; a seventh semiconductor region;
a gate electrode;
a gate insulating layer; and
a second electrode provided on the fifth semiconductor region and the seventh semiconductor region.

20 Claims, 6 Drawing Sheets

(51) Int. Cl.
   *H01L 27/07*   (2006.01)
   *H01L 21/761*  (2006.01)
   *H01L 29/739*  (2006.01)
   *H01L 29/861*  (2006.01)

(56) References Cited

U.S. PATENT DOCUMENTS

| | | |
|---|---|---|
| 9,214,535 B2 | 12/2015 | Matsudai et al. |
| 2009/0001411 A1* | 1/2009 | Tokura ............... H01L 27/0664 |
| | | 257/140 |
| 2009/0242931 A1* | 10/2009 | Tsuzuki ............... H01L 29/167 |
| | | 257/143 |
| 2013/0087829 A1* | 4/2013 | Tanabe .............. H01L 29/66348 |
| | | 257/140 |
| 2013/0260515 A1* | 10/2013 | Mizushima ....... H01L 29/66325 |
| | | 438/135 |
| 2014/0061875 A1 | 3/2014 | Ogura et al. |
| 2015/0155277 A1 | 6/2015 | Ogura et al. |
| 2015/0200247 A1* | 7/2015 | Schmidt ............ H01L 29/66348 |
| | | 257/140 |

* cited by examiner

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application NO. 2015-205661 filed on Oct. 19, 2015, the entire contents of which are incorporated herein by reference.

FIELD

An embodiment described herein relates generally to a semiconductor device and a method of manufacturing a semiconductor device.

BACKGROUND

A reverse conducting insulated gate bipolar transistor (RC-IGBT) is a semiconductor device used for power conversion and the like. The RC-IGBT includes an IGBT and a diode which are connected in reverse parallel. In the RC-IGBT, a voltage oscillation may occur when the diode is switched. The voltage oscillation may causes malfunctions in other circuit elements connected to the RC-IGBT. For this reason, it is desirable that the voltage oscillation be small.

DETAILED DESCRIPTION

Figure 1:
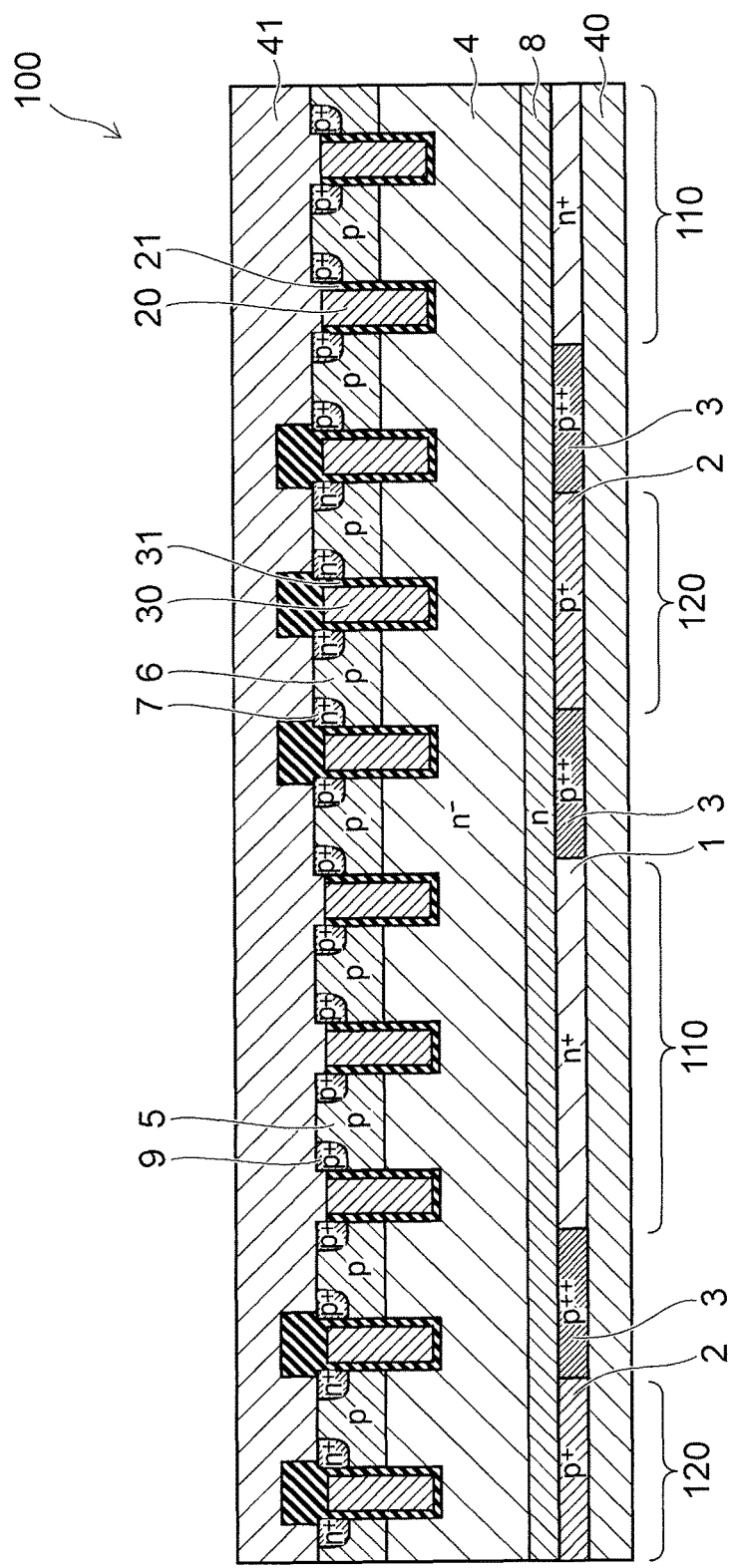
FIG. 1 is a sectional view showing a part of a semiconductor device according to an embodiment.

Exemplary embodiments will be described below with reference to the accompanying drawings.

The drawings are schematic or conceptual; and the relationships between the thickness and width of portions, the proportions of sizes among portions, and the like are not necessarily the same as the actual ones thereof. Further, the dimensions and proportions may be illustrated differently among drawings, even for identical portions.

Moreover, the same or corresponding elements in the drawings and the following description are denoted with the same reference numerals, and a repeated detailed description is omitted as appropriate.

An XYZ orthogonal coordinate system is used for explaining the embodiment and each modification. Z direction (third direction) is defined as a direction from a collector electrode 40 to an emitter electrode 41. X direction (first direction) is defined as a direction from an $n^+$ type cathode region 1 to a $p^+$ type collector region 2. Y direction (second direction) is defined as a direction perpendicular to the X direction and the Z direction.

In the description, the symbols $n^+$, $n$, and $n^-$ and $p^{++}$, $p^+$, and $p$ represent a relative level of an impurity concentration of each conductivity type. That is, $n^+$ represents a relatively higher n type impurity concentration than n, and $n^-$ represents a relatively lower n type impurity concentration than n. In addition, $p^{++}$ represents a relatively higher p type impurity concentration than $p^+$, and p represents a relatively lower p type impurity concentration than $p^+$.

In implementing the embodiment and each modification described below, the p type and the n type of each semiconductor region may be reversed.

A semiconductor device 100 according to an embodiment will be described with reference to FIG. 1 and FIG. 2.

FIG. 1 is a sectional view showing a part of the semiconductor devices 100 according to the embodiment.

Figure 2A:
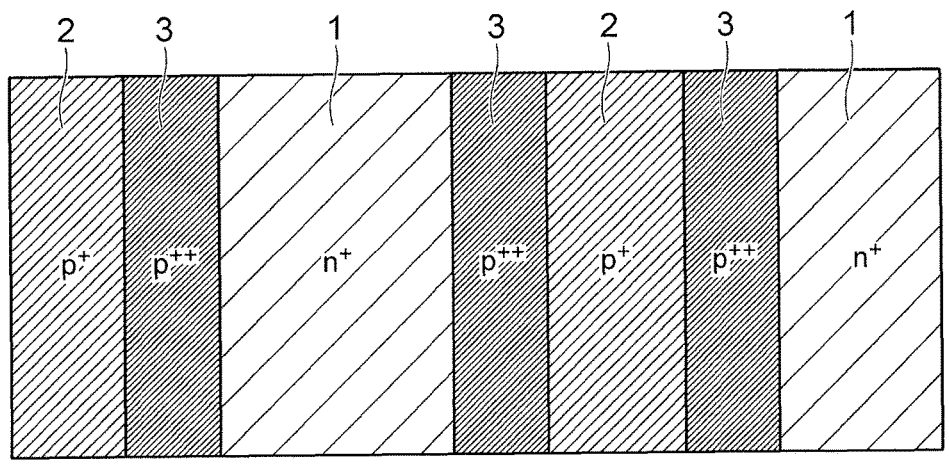
FIGS. 2A, 2B, and 2C are bottom views showing a part of the semiconductor device according to the embodiment.
Figure 2B:
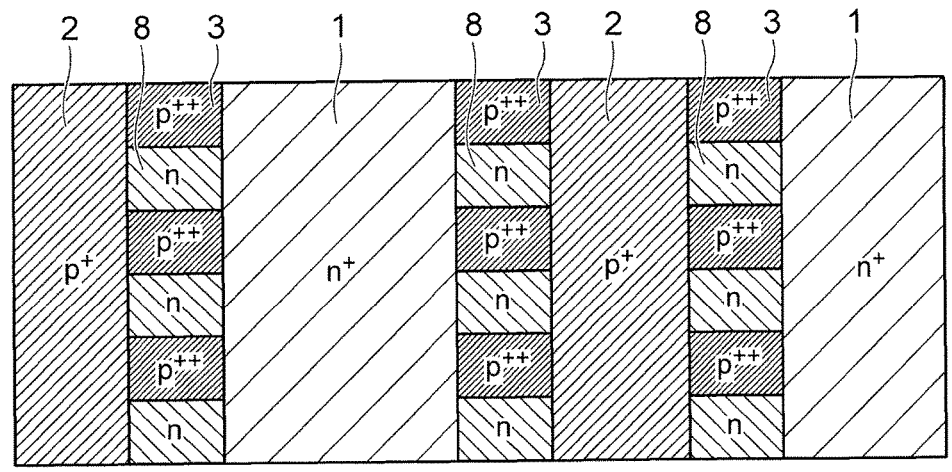
Figure 2C:
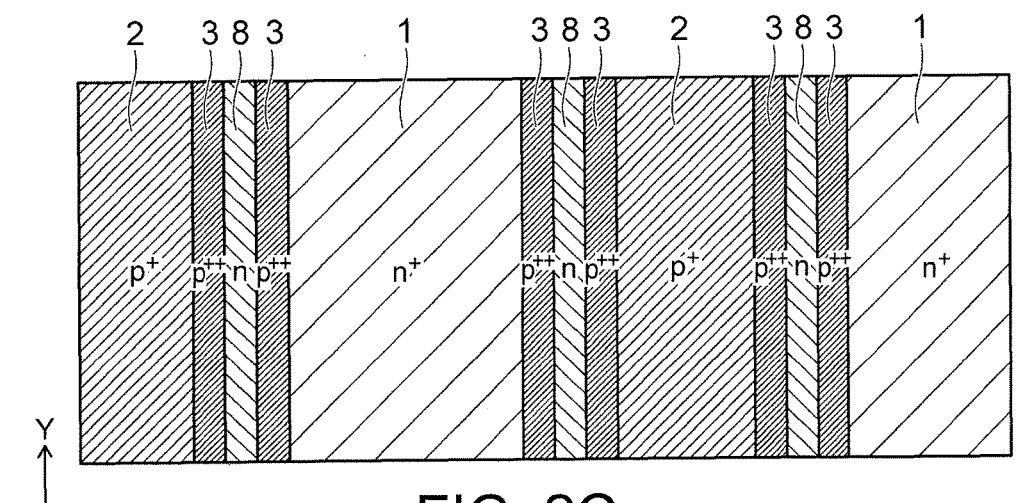

FIGS. 2A, 2B and 2C are bottom views showing a part of the semiconductor devices 100 according to the embodiment.

The semiconductor device 100 may be, for example, a reverse conducting insulated gate bipolar transistor (RC-IGBT).

The semiconductor device 100 includes a diode region 110 and an IGBT region 120 as shown in FIG. 1. The diode region 110 functions, for example, as a free wheel diode (FWD).

The diode region 110 includes an $n^+$ type (for example, first conductivity type) cathode region 1 (first semiconductor region), a p type (for example, second conductivity type) anode region 5 (fifth semiconductor region), a $p^+$ type anode region 9, an electrode 20, and an insulating layer 21.

The IGBT region 120 includes a $p^+$ type collector region 2 (second semiconductor region), a p type base region 6 (sixth semiconductor region), an $n^+$ type emitter region 7 (seventh semiconductor region), a gate electrode 30, and a gate insulating layer 31.

Both of the diode region 110 and the IGBT region 120 include also a collector electrode 40 (first electrode), an n type buffer space 8 (eighth semiconductor region), an $n^-$ type semiconductor region 4 (fourth semiconductor region), and an emitter electrode 41 (second electrode).

The collector electrode 40 is provided on a back side of the semiconductor device 100.

The $n^+$ type cathode region 1 is provided on a part of the collector electrode 40.

The $p^+$ type collector region 2 is provided on another part of the collector electrode 40.

A $p^{++}$ type semiconductor region 3 (third semiconductor region) is provided between the $n^+$ type cathode region 1 and the $p^+$ type collector region 2 on the collector electrode 40.

The n type buffer region 8 is provided on the $n^+$ type cathode region 1, the $p^+$ type collector region 2, and the $p^{++}$ type semiconductor region 3. A portion of the n type buffer region 8 may be provided to be aligned with the $n^+$ type cathode region 1, the $p^+$ type collector region 2, and the $p^{++}$ type semiconductor region 3 in an X direction. That is, a portion of the n type buffer region 8 may be provided between these regions.

An $n^-$ type semiconductor region 4 is provided on the n type buffer region 8.

A p type anode region 5 is provided on the $n^-$ type semiconductor region 4 and is located above the $n^+$ type cathode region 1. The $p^+$ type anode region 9 is selectively provided on the p type anode region 5.

The electrode 20 is aligned with the p type anode region 5 in the X direction. The insulating layer 21 is provided between the electrode 20 and each of the n⁻ type semiconductor region 4, the p type anode region 5, and the p⁺ type anode region 9.

A plurality of electrodes 20, p type anode regions 5, and p⁺ type anode regions 9 are provided in the X direction in the diode region 110 and each of them extends in the Y direction.

The p type base region 6 is provided on the n⁻ type semiconductor region 4, and is located above the p⁺ type collector region 2. The n⁺ type emitter region 7 is selectively provided on the p type base region 6.

The gate electrode 30 is aligned with the p type base region 6 in the X direction. The gate insulating layer 31 is provided between the gate electrode 30 and each of the n⁻ type semiconductor region 4, the p type base region 6, and the n⁺ type emitter region 7.

A plurality of gate electrodes 30, p type base regions 6, and n⁺ type emitter regions 7 are provided in the X direction in the IGBT region 120 and each of them extends in the Y direction.

The emitter electrode 41 is provided on a surface of the semiconductor device 100. The emitter electrode 41 is on the p⁺ type anode region 9 and the n⁺ type emitter region 7, and is electrically connected to these semiconductor regions.

The gate insulating layer 31 is provided between the gate electrode 30 and the emitter electrode 41, and these electrodes are electrically separated from each other.

The electrode 20 is electrically connected to the emitter electrode 41. Because the electrode 20 is electrically connected to the emitter electrode 41, a depletion layer extends from the insulating layer 21 to the n⁻ type semiconductor region 4 when the semiconductor device 100 is in an OFF state and accordingly, the breakdown voltage in the diode region 110 can be enhanced.

In the semiconductor device 100, the diode regions 110 and the IGBT regions 120 are alternately provided in the X direction. This causes the n⁺ type cathode regions 1 and the p⁺ type collector regions 2 to be alternately provided in the X direction. The p⁺⁺ type semiconductor region 3 is provided between the n⁺ type cathode region 1 and the p⁺ type collector region 2. Each p⁺⁺ type semiconductor region 3 is aligned with the p type anode region 5 in the Z direction. A part of the p⁺⁺ type semiconductor region 3 may be aligned with the p type base region 6 in the Z direction, as shown in FIG. 1.

The p⁺⁺ type semiconductor region 3 may be, for example, between the n⁺ type cathode region 1 and the p⁺ type collector region 2 and extends in the Y direction, as shown in FIG. 2A.

Alternatively, the p⁺⁺ type semiconductor region 3 may be one of a plurality of p⁺⁺ type semiconductor regions 3 provided between the n⁺ type cathode region 1 and the p⁺ type collector region 2 in the Y direction, as shown in FIG. 2B. In this case, the plurality of the p⁺⁺ type semiconductor region 3 and portions of the n type buffer region (or n type regions) 8 are alternately provided in the Y direction.

Alternatively, a plurality of the p⁺⁺ type semiconductor regions 3 may be provided between the n⁺ type cathode region 1 and the p⁺ type collector regions 2 in the X direction, as shown in FIG. 2C. In this case, the plurality of p⁺⁺ type semiconductor regions 3 and the portions of the n type buffer region 8 are alternately provided in the X direction.

Moreover, a plurality of p⁺⁺ type semiconductor regions 3 may be provided in the X direction and the Y direction.

In addition, lengths of the p⁺⁺ type semiconductor region 3 in the X direction and the Y direction are desirably 40 μm or more.

Now, the operation of the semiconductor device 100 will be described.

When a voltage equal to or more than a threshold value is applied to the gate electrode 30 in a condition that a positive voltage is applied to the collector electrode 40 relative to the emitter electrode 41, the IGBT become an ON state. At this time, a channel (inversion layer) is formed in a region near the gate insulating layer 31 in the p type base region 6. Electrons are injected into the n⁻ type semiconductor region 4 from the n⁺ type emitter region 7 through the channel. Holes are injected into the n⁻ type semiconductor region 4 from the p⁺ type collector region 2 and the p⁺⁺ type semiconductor region 3. Then, when the voltage applied to the gate electrode 30 becomes less than the threshold value, the channel in the p type base region 6 disappears and the IGBT becomes an OFF state.

When the IGBT is in an OFF state and a positive voltage (forward voltage) is applied to the emitter electrode 41 relative to the collector electrode 40, a forward current flows in a diode included in the diode region 110. Then, when a positive voltage (reverse voltage) is applied to the collector electrode 40 relative to the emitter electrode 41, carriers flowing in the diode region 110 are discharged from the collector electrode 40 and the emitter electrode 41.

Examples of materials for each element will now be described.

The n⁺ type cathode region 1, the p⁺ type collector region 2, the p⁺⁺ type semiconductor region 3, the n⁻ type semiconductor region 4, the p type anode region 5, the p⁺ type anode region 9, the p type base region 6, the n⁺ type emitter region 7, and the n type buffer region 8 include silicon, silicon carbide, gallium nitride, or gallium arsenide as a semiconductor material.

Arsenic, phosphorus, or antimony can be used as n type impurities added to the semiconductor material. Boron can be used as p type impurities.

The electrode 20 and the gate electrode 30 include a conductive material, such as polysilicon.

The insulating layer 21 and the gate insulating layer 31 include an insulating material, such as silicon oxide.

The collector electrode 40 and the emitter electrode 41 include metal, such as aluminum.

Next, an example of a method for manufacturing the semiconductor device 100 according to the embodiment will be described with reference to FIG. 3 and FIG. 4.

Figure 3A:
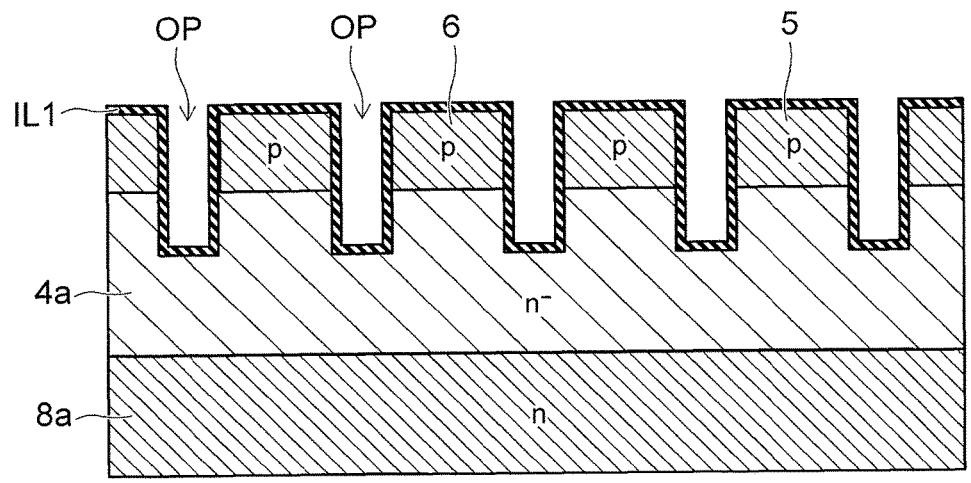
FIGS. 3A and 3B are sectional views showing steps of manufacturing the semiconductor device according to the embodiment.
Figure 3B:
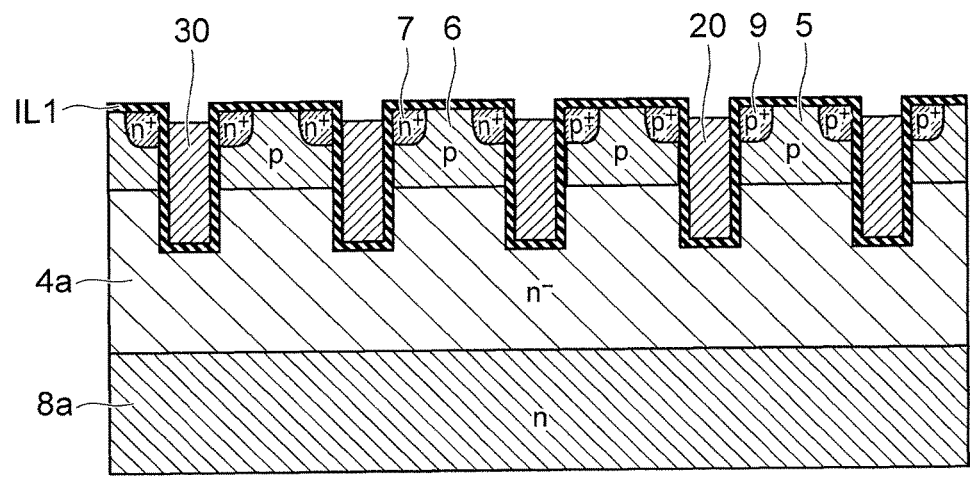
Figure 4A:
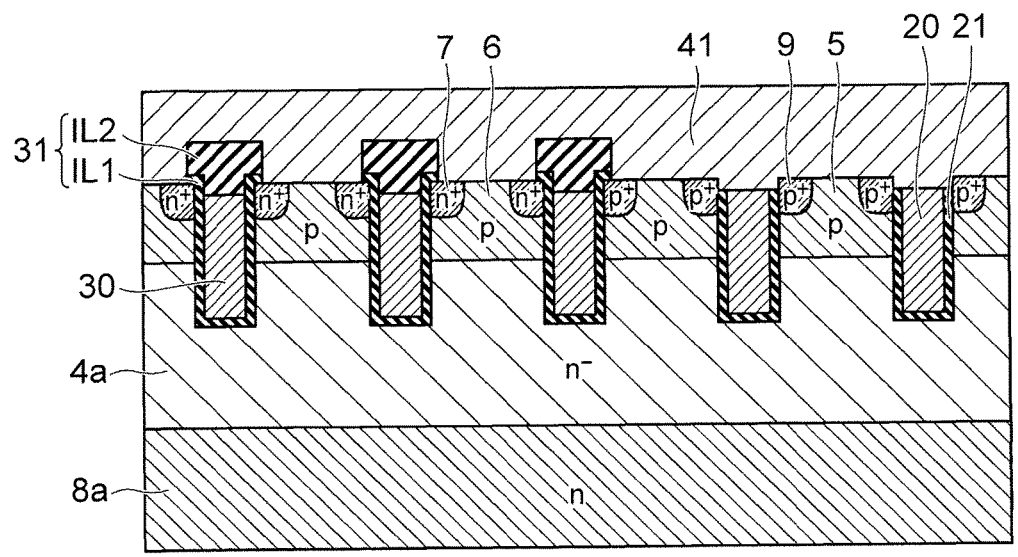
FIGS. 4A and 4B are sectional views showing steps of manufacturing the semiconductor device according to the embodiment.
Figure 4B:
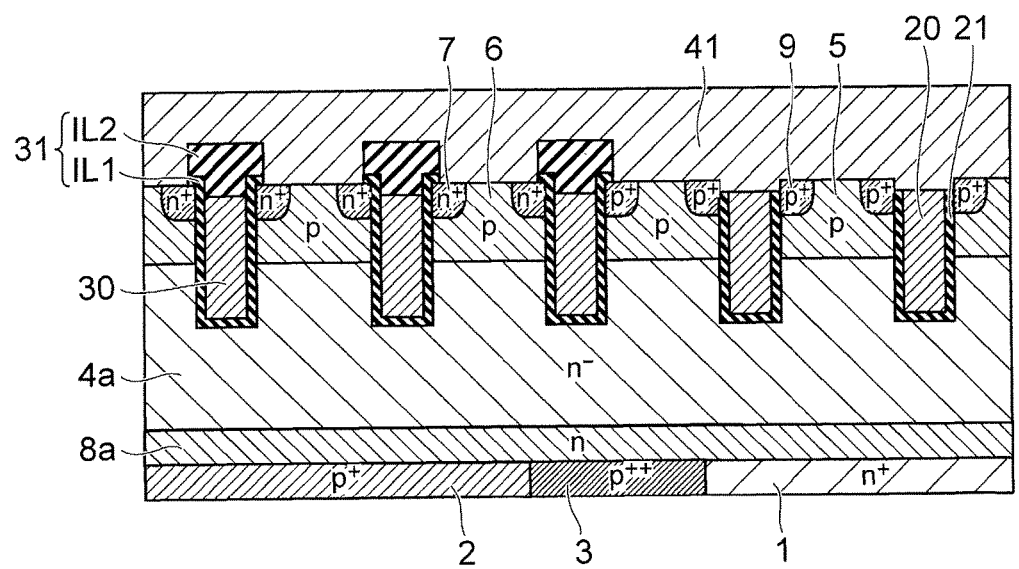
Figure 4B:
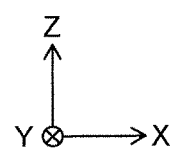

FIG. 3 and FIG. 4 are sectional views showing steps of manufacturing the semiconductor device 100 according to the embodiment.

Firstly, a semiconductor substrate including an n type semiconductor layer 8a and an n⁻ type semiconductor layer 4a is prepared. Then, p type impurities are ion-implanted into a surface of the n⁻ type semiconductor layer 4a to form a p type semiconductor region. Subsequently, a plurality of openings OP which penetrate the p type semiconductor region and reach the n⁻ type semiconductor layer 4a are formed. A portion of the p type semiconductor region being between the openings OP is corresponding to the p type anode region 5, and another portion is corresponding to the p type base region 6. Subsequently, an insulating layer IL1 is formed on the inner walls of the openings OP and the surface of the p type semiconductor region by thermal oxidation as shown in FIG. 3A.

Next, a conductive layer is formed on the insulating layer IL1. The conductive layer is etched back to recess its surface, and a plurality of electrodes separated each other are formed accordingly. Some of the plurality of electrodes are corresponding to each electrode 20, and the others are corresponding to each gate electrode 30. Then, the p type impurities are ion-implanted into a part of a surface of the p type anode region 5 to form the p$^+$ type anode region 9. N type impurities are ion-implanted into a part of a surface of the p type base region 6 to form an n$^+$ type emitter region 7. This step is shown in FIG. 3B.

Next, an insulating layer IL2 which covers the electrode 20 and a gate electrode 30 is formed. Then, the insulating layers IL1 and IL2 are patterned in a manner that the p$^+$ type anode region 9, the n$^+$ type emitter region 7, and the electrode 20 are exposed. The exposed p$^+$ type anode region 9, the exposed n$^+$ type emitter region 7, and the exposed electrode 20 are then covered with a metal layer, so that the emitter electrode 41 is formed as shown in FIG. 4A.

Next, a back surface of the n type semiconductor layer 8a is ground until the n type semiconductor layer 8a becomes a predetermined thickness. Then, the back surface of the n type semiconductor layer 8a is ion-implanted with the n type impurities and the p type impurities serially to form the n$^+$ type cathode region 1, the p$^+$ type collector region 2, and the p$^{++}$ type semiconductor region 3. Finally, a metal layer which covers these semiconductor regions is formed to form the collector electrode 40, resulting in the semiconductor device 100.

Now, the action and effect according to the embodiment will be described.

Firstly, movement of carriers in the diode region 110 in switching of a voltage applied to the diode region 110 from a forward direction to a reverse direction will be described. When a reverse voltage is applied to the diode region 110, the carriers accumulated in the n$^-$ type semiconductor region 4 are discharged through the collector electrode 40 and the emitter electrode 41. At this time, switching loss of the semiconductor device 100 can be reduced by shortening a time required to discharge the carriers (recovery time). For reducing the switching loss, it is effective to reduce an amount of carriers injected into the diode region 110 while the forward current flows.

However, the reduction of the amount of injected carriers causes a depletion layer to extend faster from a pn junction plane which is between the n$^-$ type semiconductor region 4 and the p type anode region 5 when a reverse voltage is applied. When the depletion layer reaches the n$^+$ type cathode region 1, the faster the depletion layer extends, the larger a voltage oscillation occurring between the collector electrode 40 and the emitter electrode 41 becomes.

Regarding the matters described above, the inventors of the disclosure found out the following matters.

When the reverse voltage is applied to the diode region 110 and then the depletion layer extends from the pn junction plane, the holes are injected from the collector electrode 40 side in the IGBT region 120. Because of the injected holes, the extending speed of the depletion layer near the n$^+$ type cathode region 1 can be reduced.

On the basis of the perception described above, the semiconductor device 100 according to the embodiment is provided with the p$^{++}$ type semiconductor region 3. The p$^{++}$ type semiconductor region 3 is between the n$^+$ type cathode region 1 and the p$^+$ type collector region 2 and has a higher p type impurity concentration than the p$^+$ type collector region 2.

Providing the p$^{++}$ type semiconductor region 3 allows more holes to be injected into the diode region 110 from the p$^{++}$ type semiconductor region 3 when the reverse voltage is applied to the diode region 110 and the depletion layer extends. As a result, the extending speed of the depletion layer near the n$^+$ type cathode region 1 can be reduced, while enhancing a discharge speed of carriers near the pn junction plane.

Moreover, by providing the p$^{++}$ type semiconductor region 3, it becomes possible to reduce the extending speed of the depletion layer near the n$^+$ type cathode region 1 and also reduce the switching loss of the IGBT.

This is because of the following reason.

When the p type impurity concentration of the p$^+$ type collector region 2 is reduced, injection of the holes into the IGBT region 120 in an ON state of the IGBT is reduced. Accordingly, when the IGBT is turned off, a time to discharge the carriers from the IGBT region 120 can be shortened and the switching loss of the IGBT can be reduced.

However, if the p type impurity concentration of the p$^+$ type collector region 2 is reduced in a condition that the p$^{++}$ type semiconductor region 3 is not provided, an amount of the holes injected from the IGBT region 120 is reduced when the reverse voltage is applied to the diode region 110. That is, the voltage oscillation becomes larger when the diode is switched.

In contrast, according to the embodiment, when the reverse voltage is applied to the diode region 110, the holes are injected from the p$^{++}$ type semiconductor region 3 even when the p type impurity concentration of the p$^+$ type collector region 2 is reduced. Accordingly, the voltage oscillation can be reduced by the holes injected from the p$^{++}$ type semiconductor region 3, while the switching loss of the IGBT is reduced by reducing the p type impurity concentration of the p$^+$ type collector region 2.

As described above, according to the embodiment, a semiconductor device is provided which can reduce a voltage oscillation.

According to the embodiment, the voltage oscillation can be reduced when the diode is switched, while reducing the switching loss of both of the diode and the IGBT included in the semiconductor device.

Moreover, the p$^{++}$ type semiconductor region 3 is aligned with the p type anode region 5 in the Z direction, so that the holes can be injected efficiently from the p$^{++}$ type semiconductor region 3 to the depletion layer extending from the pn junction plane when the reverse voltage is applied to the diode region 110. This can reduce the voltage oscillation more when the diode is switched.

In addition, when the n$^+$ type cathode regions 1 and the p$^+$ type collector regions 2 are alternatively provided in the X direction and the p$^{++}$ type semiconductor region 3 is provided between each of these, as shown in FIG. 1, it is possible to inject the holes from the both sides of the n$^+$ type cathode region 1 when the reverse voltage is applied to the diode region 110. Accordingly, the voltage oscillation can be reduced further more, while reducing the switching loss of the semiconductor device.

First Modification

Figure 5:
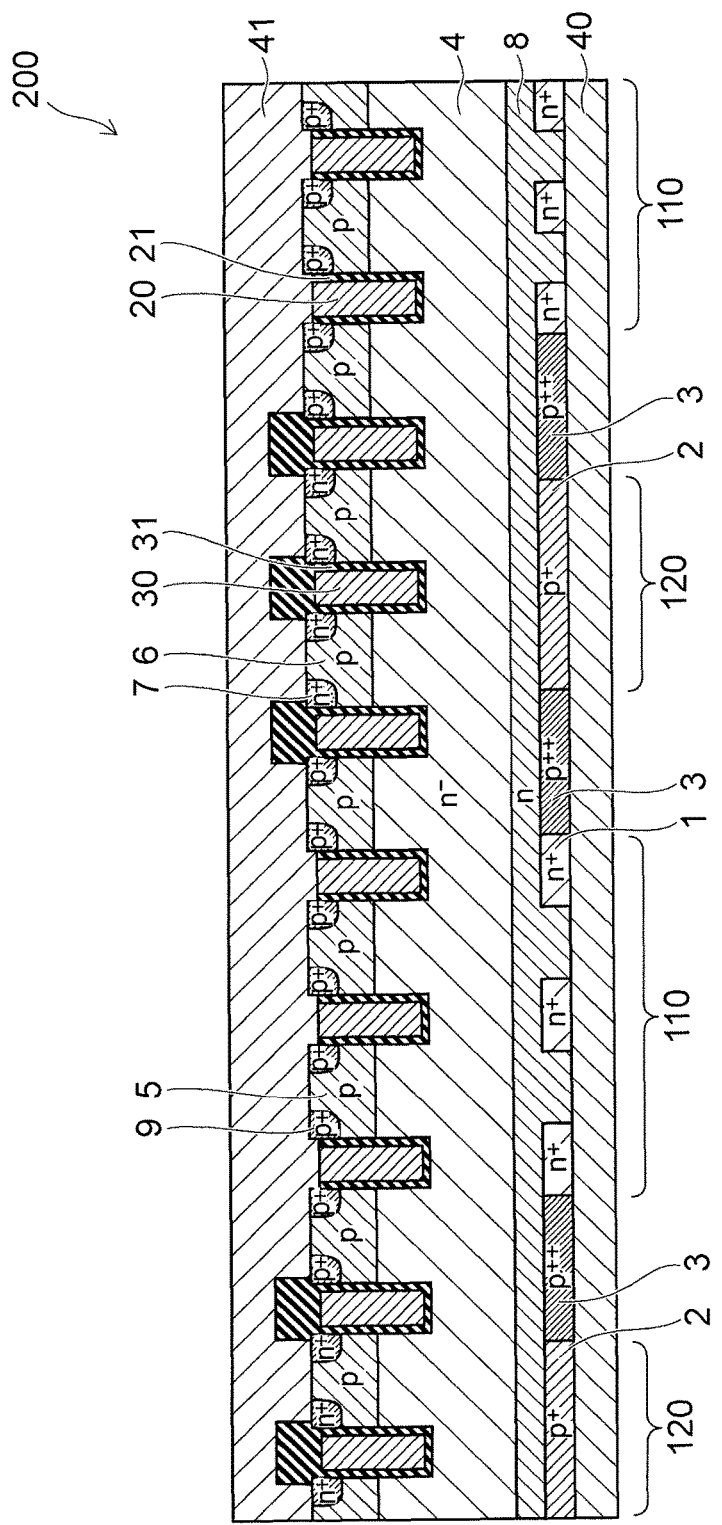
FIG. 5 is a sectional view showing a part of a semiconductor device according to a first modification of the embodiment.

FIG. 5 is a sectional view showing a part of a semiconductor device 200 according to a first modification of the embodiment.

As shown in FIG. 5, a plurality of n$^+$ type cathode regions 1 may be provided in each diode region 110 and the n$^+$ type cathode regions 1 and portions of an n type buffer region 8 are alternatively provided in the X direction.

According to the modification, an area of the n$^+$ type cathode regions 1 in a diode region 110 can be reduced and injection of electrons from a collector electrode 40 can be reduced when a forward voltage is applied to the diode. Accordingly, a recovery time of the diode can be shortened and switching loss of the semiconductor device can be reduced.

As described above, there is a concern that a voltage oscillation occurs when the recovery time is shortened. According to the embodiment, however, it is possible to reduce the voltage oscillation suitably. The modification, accordingly, can reduce the switching loss of the semiconductor device further more, while reducing the voltage oscillation when the diode is switched.

Second Modification

Figure 6:
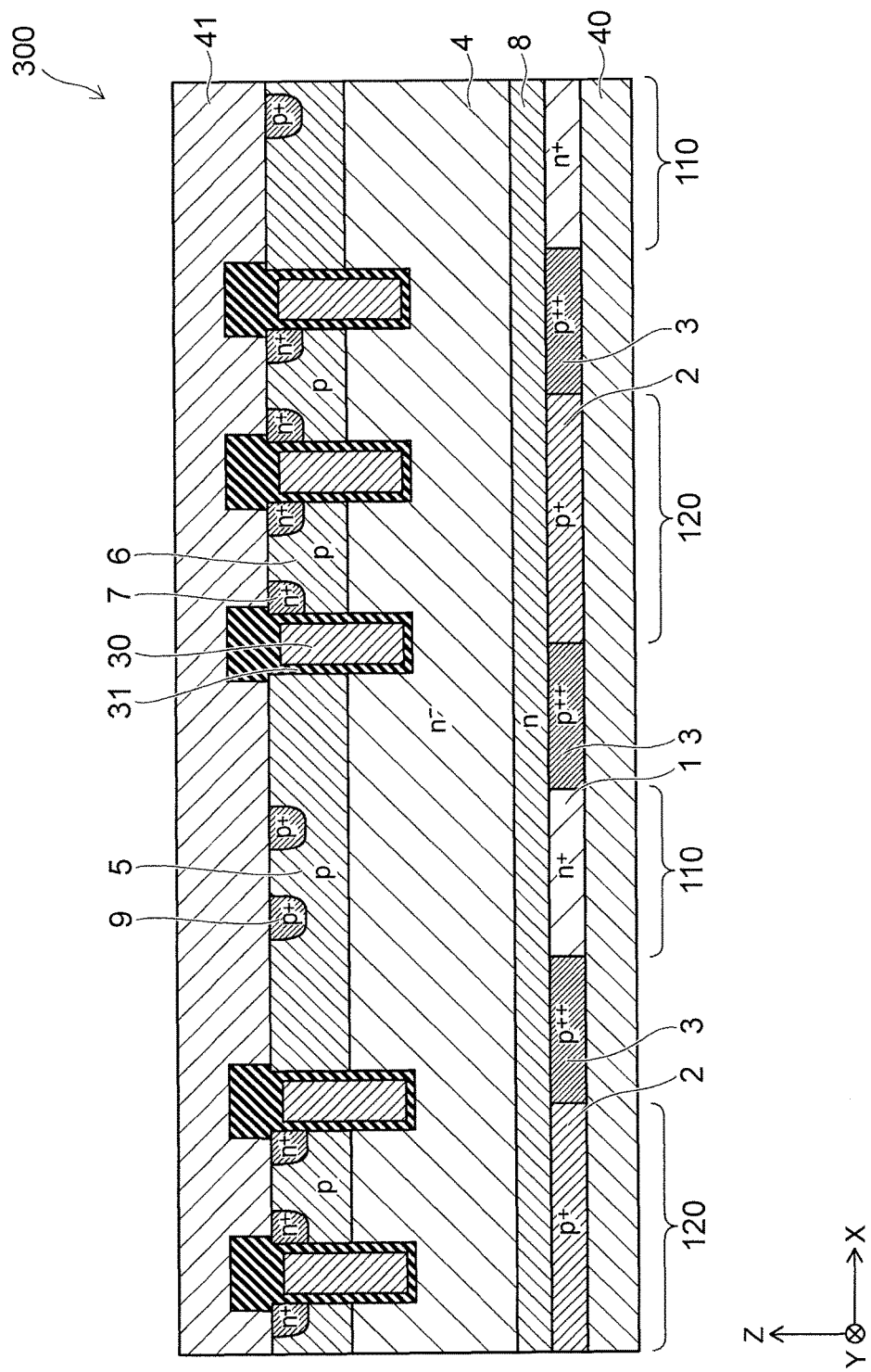
FIG. 6 is a sectional view showing a part of a semiconductor device according to a second modification of the embodiment.

FIG. 6 is a sectional view showing a part of a semiconductor device 300 according to a second modification of the embodiment.

The invention according to the embodiment can be applied to a semiconductor device which does not include an electrode 20 and an insulating layer 21 in a diode region 110, as shown in FIG. 6.

In the semiconductor device 300, a p type anode region 5 is provided on an n⁻ type semiconductor region 4, and is between each of gate electrodes 30 in the X direction. The p⁺ type anode region 9 is selectively provided on the p type anode region 5.

This modification also can reduce voltage oscillation when the diode is switched while reducing switching loss of the semiconductor device, as well as the semiconductor device shown in FIG. 1.

The relative level of the impurity concentration among individual semiconductor regions in the embodiment and each modification described above can be checked using a scanning electrostatic capacity microscope (SCM). In addition, the carrier concentration in each semiconductor region is regarded as the same as the impurity concentration that is activated in each semiconductor region. Accordingly, the relative level of the carrier concentration among individual semiconductor regions can be checked using the SCM.

Moreover, the impurity concentration in each semiconductor region can be measured by, for example, a secondary ion mass spectroscopy (SIMS).

Specific configuration of each element, including the n⁺ type cathode region 1, the p⁺ type collector region 2, the n⁻ type semiconductor region 4, the p type anode region 5, the p type base region 6, the n⁺ type emitter region 7, the n type buffer region 8, the p⁺ type anode region 9, the electrode 20, the insulating layer 21, the gate electrode 30, the gate insulating layer 31, the collector electrode 40, or the emitter electrode 41, may be appropriately selected from known techniques by a person skilled in the art.

The embodiments explained above can be combined with each other to be carried out.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a first semiconductor region of a first conductivity type provided on a part of the first electrode;
a second semiconductor region of a second conductivity type provided on another part of the first electrode;
a third semiconductor region of the second conductivity type provided between the first semiconductor region and the second semiconductor region on the first electrode and having a higher carrier concentration of the second conductivity type than the second semiconductor region;
a fourth semiconductor region of the first conductivity type provided above the first semiconductor region, the second semiconductor region, and the third semiconductor region;
a fifth semiconductor region of the second conductivity type provided on the fourth semiconductor region and located above the first semiconductor region;
a sixth semiconductor region of the second conductivity type provided on the fourth semiconductor region and located above the second semiconductor region;
a seventh semiconductor region of the first conductivity type selectively provided on the sixth semiconductor region;
a gate electrode;
a gate insulating layer provided between the gate electrode and each of the fourth semiconductor region, the sixth semiconductor region, and the seventh semiconductor region; and
a second electrode provided on the fifth semiconductor region and the seventh semiconductor region.

2. The semiconductor device, according to claim 1, further comprising:
an eighth semiconductor region of the first conductivity type of which at least a part is provided between the fourth semiconductor region and each of the first semiconductor region, the second semiconductor region, and the third semiconductor region, and
wherein a carrier concentration of the first conductivity type of the eighth semiconductor region is lower than a carrier concentration of the first conductivity type of the first semiconductor region and higher than a carrier concentration of the first conductivity type of the fourth semiconductor region.

3. The semiconductor device, according to claim 2, wherein
a plurality of the third semiconductor regions are provided between the first semiconductor region and the second semiconductor region, and
the plurality of the third semiconductor regions and portions of the eighth semiconductor region are alternately provided in a second direction perpendicular to a first direction being from the first semiconductor region to the second semiconductor region.

4. The semiconductor device, according to claim 2, wherein
a plurality of the first semiconductor regions are provided in a first direction being from the first semiconductor region to the second semiconductor region, and
the plurality of the first semiconductor regions and portions of the eighth semiconductor region are alternately provided in the first direction.

5. The semiconductor device, according to claim 1, wherein
at least a portion of the third semiconductor region is aligned with a portion of the fifth semiconductor region in a third direction being from the first electrode to the second electrode.

6. The semiconductor device, according to claim 1, wherein a plurality of the first semiconductor regions, a plurality of the second semiconductor regions, and a plurality of the third semiconductor regions are respectively provided in a first direction being from the first semiconductor region to the second semiconductor region, the plurality of first semiconductor regions and the plurality of second semiconductor regions are alternately provided in the first direction, and each of the plurality of third semiconductor regions is provided between each of the plurality of the first semiconductor regions and each of the plurality of the second semiconductor regions.

7. The semiconductor device, according to claim 1, wherein the first semiconductor region comprises a plurality of semiconductor regions of the first conductivity type.

8. The semiconductor device, according to claim 1, further comprising a ninth semiconductor region of the second conductivity type selectively provided on the fifth semiconductor region.

9. The semiconductor device, according to claim 1, wherein the first semiconductor region, the fourth semiconductor region and the fifth semiconductor region constitute a diode, and the second semiconductor region, the fourth semiconductor region, the sixth semiconductor region, the seventh semiconductor region and the gate constitute an insulated gate bipolar transistor.

10. A semiconductor device comprising:

a first electrode;

a first semiconductor region of a first conductivity type provided on a part of the first electrode;

a second semiconductor region of a second conductivity type provided on another part of the first electrode;

a third semiconductor region of the second conductivity type provided between the first semiconductor region and the second semiconductor region on the first electrode and having a higher carrier concentration of the second conductivity type than the second semiconductor region;

a fourth semiconductor region of the first conductivity type provided above the first semiconductor region, the second semiconductor region, and the third semiconductor region;

a fifth semiconductor region of the second conductivity type provided on the fourth semiconductor region and located above the first semiconductor region;

a sixth semiconductor region of the second conductivity type provided on the fourth semiconductor region and located above the second semiconductor region;

a seventh semiconductor region of the first conductivity type selectively provided on the sixth semiconductor region;

a gate electrode;

a gate insulating layer provided between the gate electrode and each of the fourth semiconductor region, the sixth semiconductor region, and the seventh semiconductor region; and a second electrode provided on the fifth semiconductor region and the seventh semiconductor region, wherein at least a portion of the third semiconductor region is aligned with a portion of the fifth semiconductor region in a third direction being from the first electrode to the second electrode.

11. The semiconductor device, according to claim 10, further comprising:

an eighth semiconductor region of the first conductivity type of which at least a part is provided between the fourth semiconductor region and each of the first semiconductor region, the second semiconductor region, and the third semiconductor region, and wherein a carrier concentration of the first conductivity type of the eighth semiconductor region is lower than a carrier concentration of the first conductivity type of the first semiconductor region and higher than a carrier concentration of the first conductivity type of the fourth semiconductor region.

12. The semiconductor device, according to claim 10, wherein a plurality of the third semiconductor regions are provided between the first semiconductor region and the second semiconductor region, and the plurality of the third semiconductor regions and portions of the eighth semiconductor region are alternately provided in a second direction perpendicular to a first direction being from the first semiconductor region to the second semiconductor region.

13. The semiconductor device, according to claim 10, wherein a plurality of the first semiconductor regions are provided in a first direction being from the first semiconductor region to the second semiconductor region, and the plurality of the first semiconductor regions and portions of the eighth semiconductor region are alternately provided in the first direction.

14. The semiconductor device, according to claim 10, wherein a plurality of the first semiconductor regions, a plurality of the second semiconductor regions, and a plurality of the third semiconductor regions are respectively provided in a first direction being from the first semiconductor region to the second semiconductor region, the plurality of first semiconductor regions and the plurality of second semiconductor regions are alternately provided in the first direction, and each of the plurality of third semiconductor regions is provided between each of the plurality of the first semiconductor regions and each of the plurality of the second semiconductor regions.

15. The semiconductor device, according to claim 10, wherein the first semiconductor region comprises a plurality of semiconductor regions of the first conductivity type.

16. The semiconductor device, according to claim 10, further comprising a ninth semiconductor region of the second conductivity type selectively provided on the fifth semiconductor region.

17. The semiconductor device, according to claim 10, wherein the first semiconductor region, the fourth semiconductor region and the fifth semiconductor region constitute a diode, and the second semiconductor region, the fourth semiconductor region, the sixth semiconductor region, the seventh semiconductor region and the gate constitute an insulated gate bipolar transistor.

18. A method of manufacturing a semiconductor device comprising:

forming a structure comprising a first semiconductor region of a first conductivity type;

a second semiconductor region of a second conductivity type;

a third semiconductor region of the second conductivity type provided between the first semiconductor region and the second semiconductor region on the first electrode and having a higher carrier concentration of the second conductivity type than the second semiconductor region;

a fourth semiconductor region of the first conductivity type provided above the first semiconductor region, the second semiconductor region, and the third semiconductor region;

a fifth semiconductor region of the second conductivity type provided on the fourth semiconductor region and located above the first semiconductor region;

a sixth semiconductor region of the second conductivity type provided on the fourth semiconductor region and located above the second semiconductor region;

a seventh semiconductor region of the first conductivity type selectively provided on the sixth semiconductor region;

a gate electrode;

a gate insulating layer provided between the gate electrode and each of the fourth semiconductor region, the sixth semiconductor region, and the seventh semiconductor region;

forming a first electrode and a second electrode, the second electrode provided on the fifth semiconductor region and the seventh semiconductor region.

19. The method, according to claim 18, further comprising:

forming an eighth semiconductor region of the first conductivity type of which at least a part is provided between the fourth semiconductor region and each of the first semiconductor region, the second semiconductor region, and the third semiconductor region, and wherein a carrier concentration of the first conductivity type of the eighth semiconductor region is lower than a carrier concentration of the first conductivity type of the first semiconductor region and higher than a carrier concentration of the first conductivity type of the fourth semiconductor region.

20. The method, according to claim 18, wherein at least a portion of the third semiconductor region is aligned with a portion of the fifth semiconductor region in a third direction being from the first electrode to the second electrode.

* * * * *